United States Patent [19]

Suckling et al.

[11] Patent Number: 5,347,229

[45] Date of Patent: Sep. 13, 1994

[54] POWER AMPLIFIER WITH HARMONICALLY TRAPPED HETEROJUNCTION BIPOLAR TRANSISTOR

[75] Inventors: Charles Suckling, Rushden; Glenn Collinson, Hitchin, both of United Kingdom

[73] Assignee: Texas Instruments Incorporated, Dallas, Tex.

[21] Appl. No.: 990,996

[22] Filed: Dec. 16, 1992

[30] Foreign Application Priority Data

Dec. 16, 1991 [GB] United Kingdom ............... 9126616

[51] Int. Cl.$^5$ ............................................. H03F 3/217
[52] U.S. Cl. ........................................ 330/251; 330/286; 330/306
[58] Field of Search ................ 330/53, 56, 185, 192, 330/207 A, 251, 286, 306

[56] References Cited

U.S. PATENT DOCUMENTS

| | | |
|---|---|---|
| 4,717,884 | 1/1988 | Mitzlaff .................... 330/151 |
| 5,095,285 | 3/1992 | Khatibzadeh ............. 330/306 |
| 5,146,178 | 9/1992 | Nojima et al. ............. 330/251 |
| 5,164,683 | 11/1992 | Shields ..................... 330/307 |

FOREIGN PATENT DOCUMENTS

| | | |
|---|---|---|
| 52610 | 4/1980 | Japan ....................... 330/286 |
| 116808 | 7/1983 | Japan ....................... 330/286 |
| 146006 | 7/1986 | Japan ....................... 330/286 |

*Primary Examiner*—James B. Mullins
*Attorney, Agent, or Firm*—William E. Hiller; Richard L. Donaldson

[57] ABSTRACT

Power amplifier operating at a fixed frequency or a narrow bandwidth and based upon a non-linear gain element. The power amplifier includes a resonant circuit operably connected to the non-linear gain element, the circuit being resonant at a harmonic of substantially the band center frequency of the non-linear gain element and being arranged to dissipate energy resulting from harmonic generation by the non-linear gain element during signal amplification. In a particular aspect of the power amplifier, resonant circuits comprising inductor-capacitor harmonic trap circuits tuned to different harmonics are placed at both the input and the output of a gallium arsenide heterojunction bipolar transistor HBT providing the non-linear gain element.

9 Claims, 3 Drawing Sheets

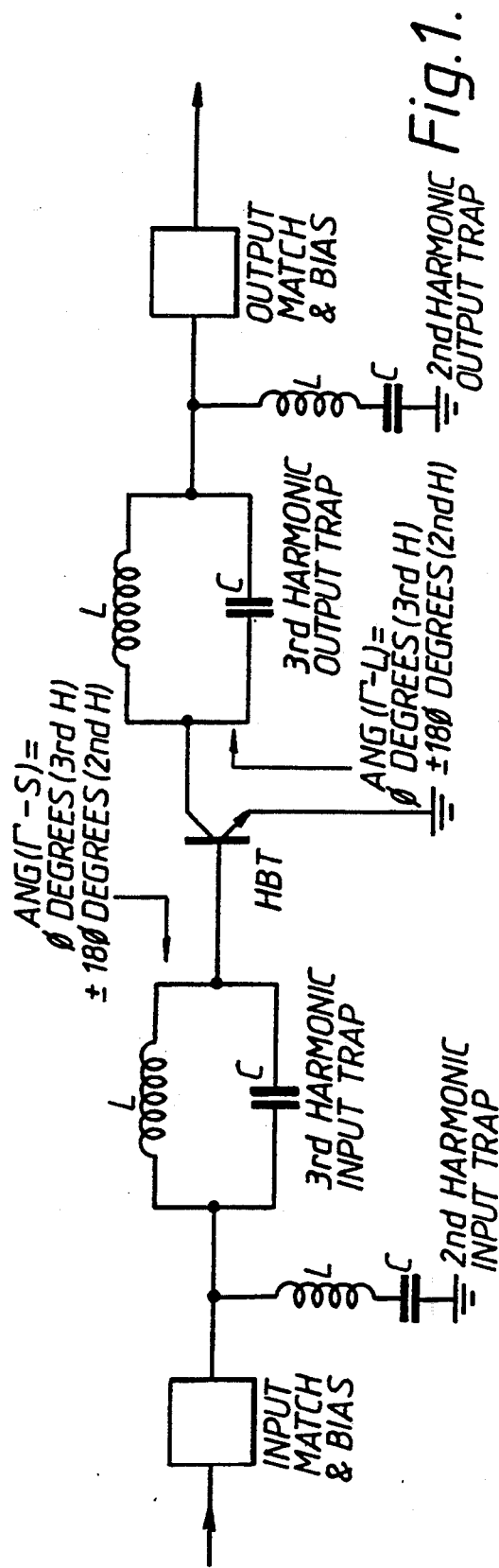
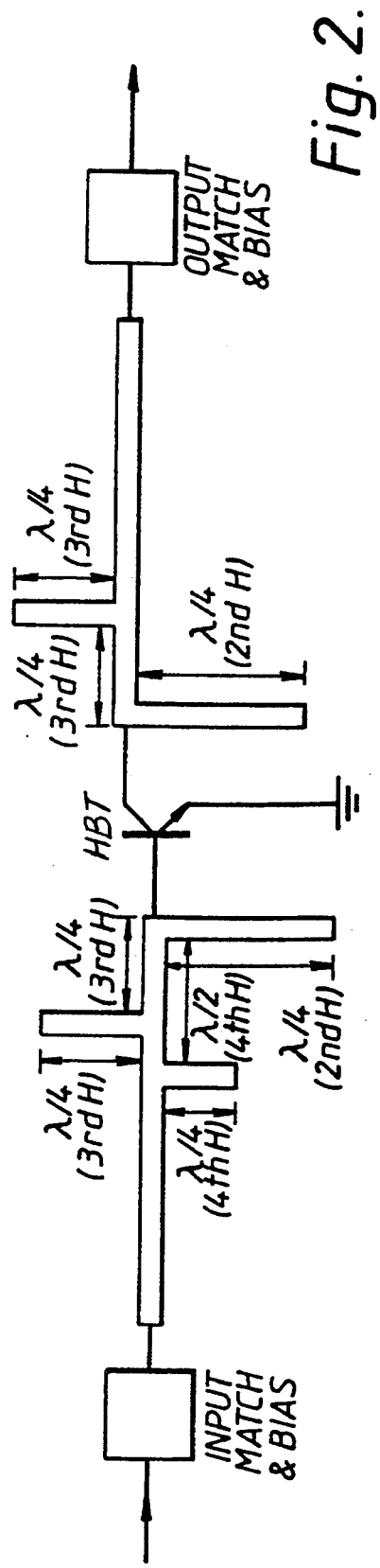

POWER AMPLIFIER WITH HARMONICALLY TRAPPED HETEROJUNCTION BIPOLAR TRANSISTOR

The present invention relates to amplifiers and in particular to power amplifiers operating in a fixed frequency or narrow band regime and based upon non-linear gain elements, such as for example a Gallium Arsenide (GaAs) Heterojunction Bipolar Transistor (HBT).

GaAs HBTs have well known high efficiency when used in microwave power amplifiers. See for example 5W Monolithic HBT amplifier for Broadband X-Band Applications. B. Bayraktaroglu, M. A. Khatibzadeh, and R. D. Hudgens. 1990 Monolithic GAAS IC symposium. They therefor e have excellent potential for use in the transmitter power amplifier in portable cellular telephones. In particular, present generation, analogue cellular (TACS, AMPS, NMT) telephones require ultra-highly efficient power amplifiers because the transmitter is constantly on whilst the operator is talking. The FM modulation scheme allows the usage of non-linear amplifier designs, and therefore the portable cellular power amplifier is usually a highly tuned, very non-linear (i.e. class C), narrow-band (<10% BW) design.

Unfortunately, the appeal of an HBT for such an application is limited because of the difficulty of realizing a design that is efficient in terms of power delivered to a load within the required band width. The present invention has been made as a result of an investigation of such inefficiency.

According to the present invention there is provided an amplifier including:
a non-linear gain providing element,
a resonant circuit associated therewith, the circuit being resonant at an harmonic of substantially band centre frequency, and
said circuit being arranged to dissipate energy resulting from harmonic generation by the element during amplification.

The present invention is expected to be particularly effective in the realization of efficient power amplifiers working above the frequency of about 0.8 GHz Placement of harmonic resonant circuits (traps) at the input or output of an HBT for example increases the efficiency of the power amplifier in particular when the phases of the reflection coefficients the harmonic frequencies are set at the device reference plane such that for even harmonics there is a short circuit phase (+/−180 degrees) and for odd harmonics an open circuit phase (0 degrees). Traps have been used in power amplifiers for the purpose of improving harmonic performance but with the present invention an improvement in efficiency is possible and has been measured at up to 40% with respect to an amplifier based on the same HBT but without trapping. Traps are particularly effective for this purpose when placed at the HBT element input where they have not been found effective for harmonic correction.

In order that features and advantages of the present invention may be further appreciated, embodiments will now be described with reference to the accompanying diagrammatic drawings, of which:

FIG. 1 represents a circuit implementation of the present invention for a GaAs HBT power amplifier, FIG. 2 represents an integrated implementation.

FIG. 1 represents an exemplary embodiment of the invention for a GaAs HBT power amplifier working at a single frequency or narrow-band within the frequency range 0.8 to 10 GHz with 2nd and 3rd harmonic trap circuits implemented on both input and output. 2nd harmonic traps with a 2nd harmonic reflection coefficient phase of 0 degrees referenced to the device plane are implemented as series resonant inductor-capacitor circuits connected from the device input to ground and the device output to ground. 3rd harmonic traps with a 3rd harmonic reflection coefficient phase of +/−180 degrees referenced to the device plane are implemented as parallel resonant inductor-capacitor circuits connected in series at the input and output. This implementation would be suitable for realization as a hybrid circuit including a discrete HBT element. In a GaAs monolithic IC implementation of this circuit the inductors could be spirals or meander lines and the capacitors of type metal-insulator-metal (MIM).

FIG. 2 represents an alternative embodiment being a GaAs monolithic IC implementation of the invention for a GaAs HBT power amplifier working at a single frequency or narrow-band above 10 GHz with the 2nd, 3rd and 4th harmonic traps on the input and 2nd and 3rd harmonic traps on the output.

In this case, all the harmonic trap circuits are quarter-wave open-stubs connected at the correct distance from the device on the input and output, 50 ohm, microstrip, feeds to give +/−180 degrees harmonic reflection coefficient phase at the device reference plane for the 2nd harmonic (input and output) and 4th harmonic (input), and 0 degrees harmonic reflection coefficient phase at the device reference plane for the 3rd harmonic (input and output).

Advantageously, the present invention might be applied to the output stage of for example a three stage HBT amplifier that is fully integrated together with matching, control and biasing circuitry.

In order that the basis for the present invention may be better appreciated, the efficiency of an HBT element operating as an amplifier will now be considered.

There are 7 variables in the design of a high efficiency single stage, narrow-band HBT RF amplifier:
- Transistor configuration (i.e. common-emitter, common-base or common collector).
- Output DC supply voltage (VCQ).
- Input DC supply voltage (VBQ).
- Input DC supply resistance (RB).
- RF drive level (PIN).
- Source and load impedances at the fundamental frequency.
- Source and load impedances at harmonic frequencies.

The last five items all affect the class of operation of the amplifier as defined by the fraction of the RF cycle that the transistor is conducting (class A=100% of the RF cycle, class B=50%, class C<50%). The effects of varying the source and load impedances at 2nd and 3rd harmonic frequencies on the collector efficiency of a class C biased (fixed PIN=9.8 dBm, VBQ=1.2 V, RB=0 ohm) HBT connected in the common emitter configuration (VCQ=6.0 V) are described.

Figure 3:
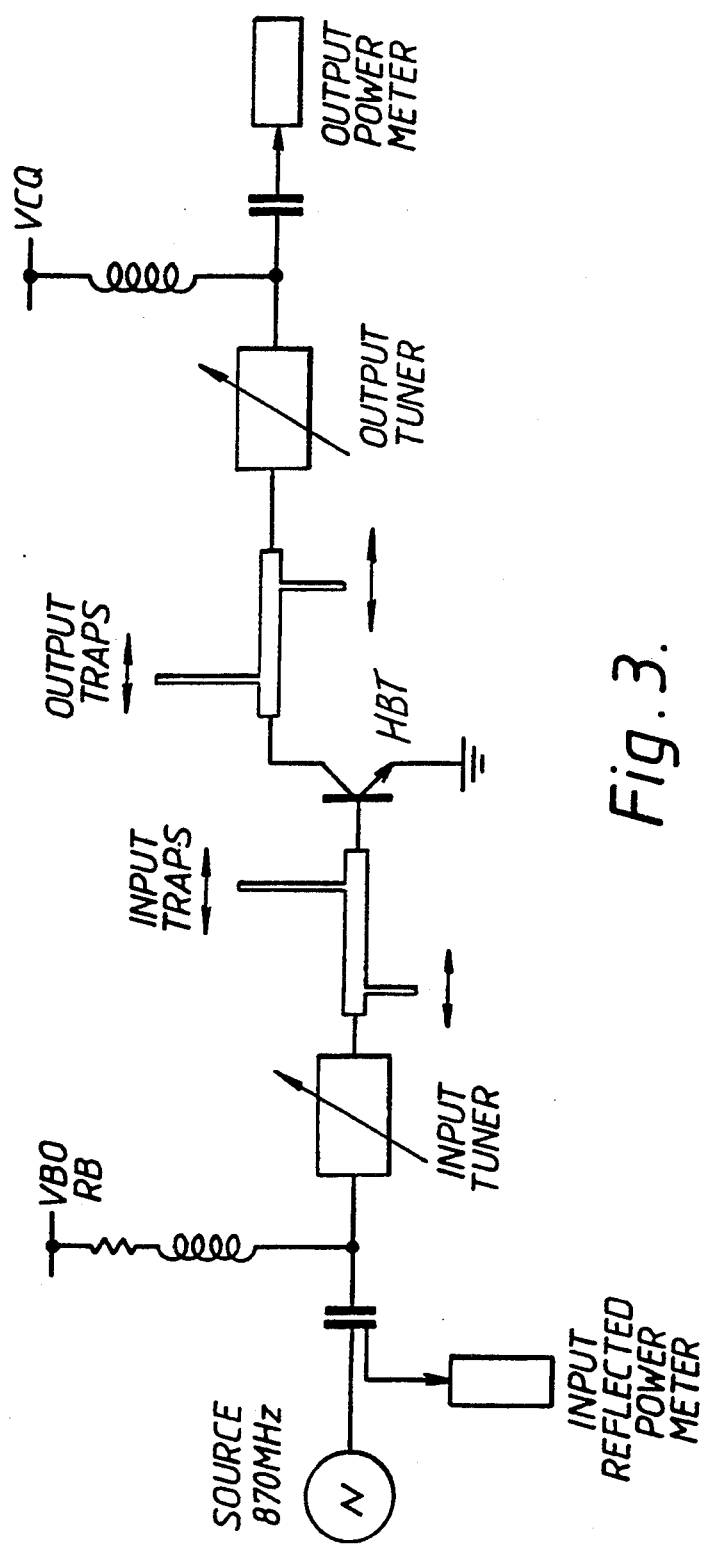
FIG. 3 represents an arrangement with which efficiency measurements may be made.

A discrete HBT with total emitter length 100 $\mu$m (5 emitter stripes of length 20 $\mu$m) was assembled into a test jig containing 50 ohm, aluminium, microstrip lines for the base and collector feeds. This test jig was then assembled into the load-pull setup shown in FIG. 3.

The input tuner was of the single sliding screw type and the output tuner was of the "twin sleeve" type. The power supplies and power meter were placed under computer control so that a real time output of collector efficiency could be obtained as the tuners were varied. Using this "efficiency meter" capability, the last procedure was to tune on the output to maximize collector efficiency with the input simultaneously tuned for minimum reflected power (i.e. with the input conjugately matched). It should be noted that, in general, the optimum output tune point for collector efficiency occurs at a significantly different T-load than for the maximum output RF power point. In fact the efficiency peak occurs when the output is mismatched by 2-3 dB.

Harmonic trap circuits were placed between the HBT and the tuners on both input and output. These were implemented as quarter-wave open-stub resonators connected to a 50 ohm microstrip line built on an epoxy-glass PCB of ER=5.0. The harmonic rejection achievable at 2nd (1.74 GHz) and 3rd (2.61 GHz) harmonics with this realization is in the range 25-30 dB. The 50 ohm microstrip line in the trap circuits also passes the DC supply to the base and emitter.

The phase of the reflection coefficient at each narmonic frequency at the device reference plane was independently varied by changing the position of the appropriate harmonic resonator on the 50 ohm microstrip line. Because the 50 ohm line had an electrical length greater than ½ wavelength at 1.74 GHz, all phases of both 2nd and 3rd harmonic reflection coefficient could be presented to the device at both input and output.

In general, when operated in a highly non-linear mode (i.e. class B or class C bias), the performance of HBTs is found to be greatly dependent on the harmonic terminations at both input and output. It should be noted therefore, that meaningful large signal data cannot be generated on these devices unless the harmonic reflection coefficients are well controlled. In other words, a load-pull test-set with similar tuners to those used here must be harmonically isolated from the HBT, before accurate data (output power, efficiency and large signal impedances) can be measured. This is because the mechanical tuners exhibit a widely varying harmonic response as a function of tuner setting.

Figure 4A:
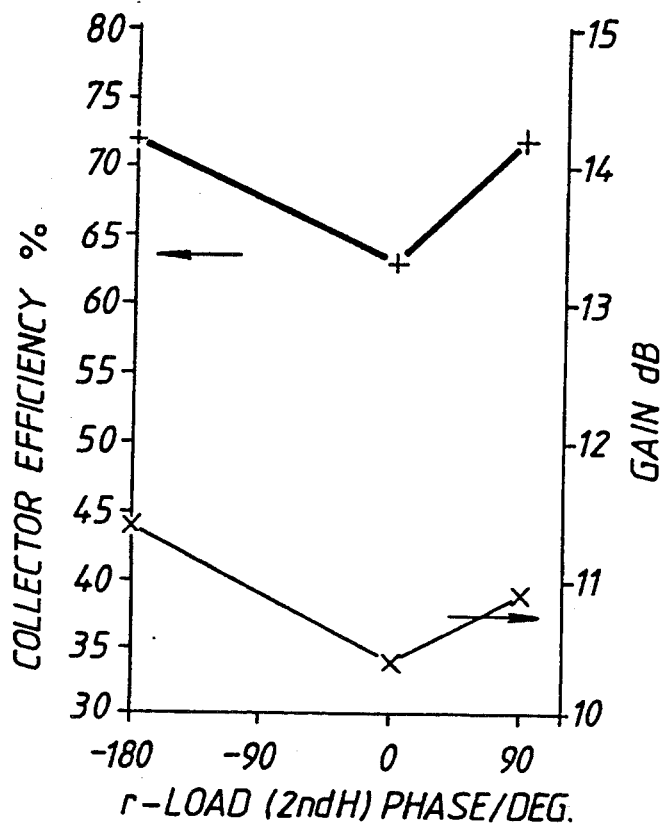
FIGS. 4(a) and 4(b) are graphs representing measured circuits characteristics.

As will be appreciated for FIGS. 4(a) and (b), collector efficiency for a common-emitter, class C biased HBT varied by 10% points when the output 2nd harmonic reflection coefficient was fixed at around 0.9 mag but varied across all phases (3rd harmonic output termination held constant). The optimum phase is short circuit (180 degrees) for the 2nd harmonic. A 13% points collector efficiency variation was seen vs output 3rd harmonic phase (2nd harmonic output termination held constant). The highest efficiency occured at open circuit (0 degrees) phase for the output 3rd harmonic.

Variation of the input harmonic terminations leads to a more significant variation in performance as will be apparent from Table I.

Figure 4B:
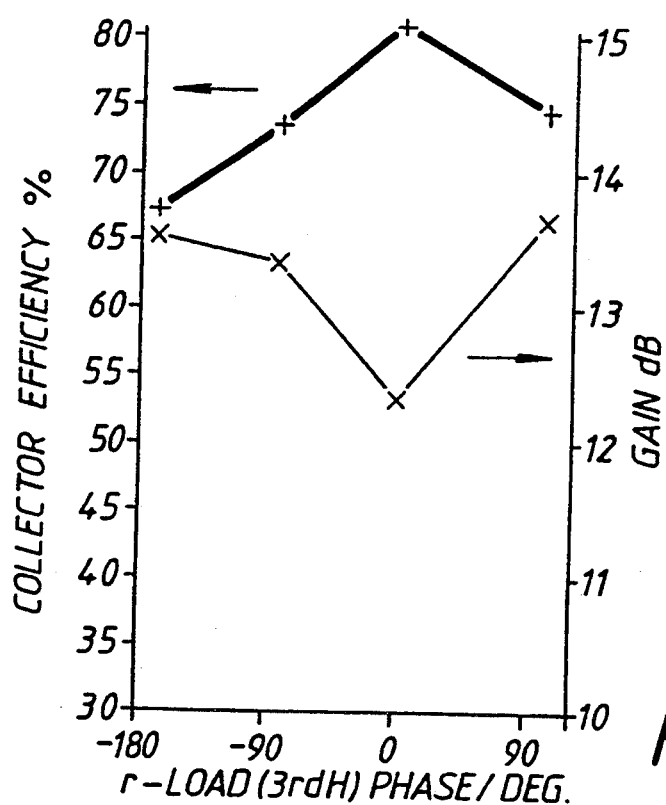

Output data is shown in FIGS. 4(a) and 4(b).

With the output harmonic terminations fixed at optimum values (s/c phase for 2nd harmonic and o/c phase for the 3rd harmonic) there was a 40% points efficiency variation as 2nd and 3rd harmonic input terminations were varied. Peak efficiency again occurred for s/c phase 2nd harmonic. However, when the stage was correctly terminated at the 2nd harmonic on the input, a variation of 3rd harmonic input terminations did not have a large effect on performance.

The optimum short circuit 2nd harmonic and open circuit 3rd harmonic terminations show the desirability of having square-wave type voltage wherefores on BOTH input and output of the HBT in order to achieve maximum efficiency.

TABLE I

| r-Source 2nd Harm (1.74 GHz) +/− .04,5d mag,and(d) | r-Source 3rd Harm (2.61 GHz) +/− .04,5d mag,ang(d) | PI +/− .2 dBm | PO +/ .1 dBm | Go +/− .3 dB | Ic +/− .2 mA | CE +/− 2% | r-Source Fund. (870 MHz) +/− .02,2d mag,ang(d) | r-Load Fund. (870 MHz) +/− .02,2d mag,ang(d) |
|---|---|---|---|---|---|---|---|---|
| 0.95. − 178d | 0.91. − 4d | 9.8 | 22.1 | 12.3 | 34.5 | 78 | 0.36. + 123d | 0.43, + 18d |
| 0.95. − 178d | 0.85. − 170d | 9.8 | 22.0 | 17.2 | 34.0 | 78 | 0.38. + 121d | 0.44. + 20d |
| 0.85. − 1d | 0.91. + 177d | 9.8 | 24.9 | 15.1 | 91.2 | 56 | 0.40. + 89d | 0.05. + 37d |
| 0.90. + 5d | 0.84. − 3d | 9.8 | 24.3 | 14.5 | 112.0 | 40 | 0.40. + 65d | 0.12. + 145d |

VCQ = 6.0 +/− 0.01 V
VBQ = 1.2 +/− 0.01 V,
ICQ = 0 mA.
RB = 0 ohms
Note for VBQ = 1.3 V.
IBQ = 1 mA, ie turn-on voltage = 1.3 V.
Therefore this is class C bias.
Input Harmonic reflection coefficients:
r-Source (1.74 GHz) = .84, +1.70 deg
r-Source (2.61 GHz) = .94, −54 deg
Output Harmonic reflection coefficients:
r-Load (1.74 GHz) = .94, +174 deg
r-Load (2.61 GHz) = .90, −10 deg

We claim:
1. A power amplifier for operation within a narrow bandwidth regime, said power amplifier comprising:
a heterojunction bipolar transistor having a base, a collector and an emitter for providing a non-linear gain;
an input terminal connected to the base of said heterojunction bipolar transistor for providing an input electrical signal thereto;
an output terminal connected to the collector of said heterojunction bipolar transistor for providing an amplified output electrical signal;
harmonic input trap circuit means interposed in the connection between said input terminal and the base of said heterojunction bipolar transistor and being resonant at a harmonic of substantially band center frequency; and
harmonic output trap circuit means interposed in the connection between the collector of said heterojunction bipolar transistor and said output terminal;

said harmonic input and output trap circuit means increasing the efficiency of the power amplifier by dissipating energy resulting from harmonic generation by said heterojunction bipolar transistor during amplification of the electrical signal.

2. A power amplifier as set forth in claim 1, wherein said harmonic input and output trap circuit means respectively include first and second resonant circuits tuned to different harmonics;

the first resonant circuits of said harmonic input and output trap circuit means being tuned to the same first harmonic; and the second resonant circuits of said harmonic input and output trap circuit means being tuned to the same second harmonic different from the first harmonic.

3. A power amplifier as set forth in claim 2, wherein said first and second resonant circuits of said harmonic input and output trap circuit means include circuits resonant at an even harmonic of substantially band center frequency to provide a short circuit phase; and said first and second resonant circuits of said harmonic input and output trap circuit means include circuits resonant at an odd harmonic of substantially band center frequency to provide an open circuit phase.

4. A power amplifier as set forth in claim 3, wherein said first and second resonant circuits of each of said harmonic input and output trap circuit means are second harmonic trap circuits and third harmonic trap circuits respectively.

5. A power amplifier as set forth in claim 4, wherein said second harmonic trap circuits comprise series resonant inductor-capacitor circuits connected from the input of said heterojunction bipolar transistor to ground and from the output of said heterojunction bipolar transistor to ground respectively.

6. A power amplifier as set forth in claim 5, wherein said third harmonic trap circuits of said harmonic input and output trap circuit means respectively comprise parallel resonant inductor-capacitor circuits connected in series at the input and at the output of said heterojunction bipolar transistor.

7. A power amplifier as set forth in claim 4, wherein said harmonic input trap circuit means further includes a third resonant circuit tuned to a different harmonic than the harmonics of said first and second resonant circuits.

8. A power amplifier as set forth in claim 7, wherein said third resonant circuit of said harmonic input trap circuit means is a fourth harmonic trap circuit.

9. A power transistor as set forth in claim 1, wherein said heterojunction bipolar transistor is a GaAs monolithic heterojunction bipolar transistor.

* * * * *